(12) United States Patent
Xu et al.

(10) Patent No.: US 10,381,603 B2
(45) Date of Patent: Aug. 13, 2019

(54) OLED DISPLAY DEVICE AND METHOD FOR DETECTING AND REPAIRING PACKAGING EFFECTS OF THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhaozhe Xu, Beijing (CN); Ji Li, Beijing (CN); Tingting Zhao, Beijing (CN); Lisen Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/571,233

(22) PCT Filed: May 4, 2017

(86) PCT No.: PCT/CN2017/083000
§ 371 (c)(1),
(2) Date: Nov. 1, 2017

(87) PCT Pub. No.: WO2018/018985
PCT Pub. Date: Feb. 1, 2018

(65) Prior Publication Data
US 2018/0233705 A1    Aug. 16, 2018

(30) Foreign Application Priority Data

Jul. 26, 2016 (CN) .......................... 2016 1 0599622

(51) Int. Cl.
*H01L 23/28* (2006.01)
*H01L 27/32* (2006.01)
(Continued)

(52) U.S. Cl.
CPC .............. *H01L 51/56* (2013.01); *H01L 23/28* (2013.01); *H01L 27/32* (2013.01); *H01L 51/5246* (2013.01); *H01L 2251/568* (2013.01)

(58) Field of Classification Search
CPC ............. H01L 27/3225; H01L 51/5246; H01L 2251/568; H01L 27/3244; H01L 51/5259
See application file for complete search history.

(56) References Cited

U.S. PATENT DOCUMENTS

2003/0066311 A1*  4/2003  Li ........................... C03C 27/06
                                                                65/43
2005/0184661 A1   8/2005  Chiu et al.
(Continued)

FOREIGN PATENT DOCUMENTS

CN    1642367 A    7/2005
CN    103247667 A  8/2013
(Continued)

OTHER PUBLICATIONS

International Search Report received for PCT Patent Application No. PCT/CN2017/083000, dated Aug. 9, 2017, 6 pages (2 pages of English Translation and 4 pages of Original Document).
(Continued)

*Primary Examiner* — Changhyun Yi
(74) *Attorney, Agent, or Firm* — Womble Bond Dickinson (US) LLP

(57) ABSTRACT

An OLED display device and a method for detecting and repairing packaging effects of the same are disclosed in order to improve the production yield of OLED display devices, which relate to the field of display technologies.
(Continued)

The OLED display device includes a substrate, an OLED element and a packaging structure, a packaging cavity being formed between the packaging structure and the substrate, the OLED element being located within the packaging cavity. The OLED display device further includes a detection unit, the detection unit being located within the packaging cavity and having a chemical activity for oxygen not lower than that of the OLED element.

19 Claims, 6 Drawing Sheets

(51) Int. Cl.
*H01L 51/52* (2006.01)
*H01L 51/56* (2006.01)

(56) References Cited

U.S. PATENT DOCUMENTS

2014/0353594 A1* 12/2014 Zeng ................... H01L 27/3225
257/40
2015/0185142 A1* 7/2015 Zeng ................... H01L 51/5259
257/40
2015/0362449 A1 12/2015 Suzuki
2017/0092701 A1* 3/2017 Uchida ............... H01L 27/3225

FOREIGN PATENT DOCUMENTS

| CN | 103730071 A | 4/2014 |
| CN | 105355645 A | 2/2016 |
| CN | 106024842 A | 10/2016 |
| SG | 87046 A1 | 3/2002 |

OTHER PUBLICATIONS

Office Action received for Chinese Patent Application No. 201610599622.X, dated Jun. 29, 2018, 13 pages (7 pages of English Translation and 6 pages of Office Action).

* cited by examiner

OLED DISPLAY DEVICE AND METHOD FOR DETECTING AND REPAIRING PACKAGING EFFECTS OF THE SAME

RELATED APPLICATION

The present application is the U.S. national phase entry of PCT/CN2017/083000, with an international filing date of Apr. 5, 2017, which claims the priority benefit of Chinese Patent Application No. 201610599622.X, filed on Jul. 26, 2016, the entire disclosure of which is incorporated herein by reference.

TECHNICAL FIELD

This disclosure relates to the field of display technologies, and in particular to an OLED display device and a method for detecting and repairing packaging effects of the same.

BACKGROUND

Organic light emitting diode (hereinafter referred to as OLED for short) display devices have attracted wide attention by virtue of characteristics such as self-luminescence, high brightness, wide view angle, high contrast, good flexibility and low energy consumption, and are widely applied to mobile phones, computer displays, full-color televisions and the like as a new-generation of display.

An OLED display device usually comprises a substrate, OLED elements and a packaging structure. The OLED element is located on the substrate. The packaging structure and the substrate jointly form a packaging cavity in which the OLED element is packaged. Since the OLED elements are quite sensitive to oxygen and/or vapor, requirements in the packaging effects of OLED display devices are usually very high. At present, in the production of OLED display devices, the packaging effect of the OLED display devices is monitored or detected to screen out OLED display devices having a packaging failure (OLED display devices in which water and/or oxygen permeates into the packaging cavity) and improve the production yield of OLED display devices.

SUMMARY

It is an objective of this disclosure to provide an OLED display device and a method for detecting and repairing packaging effects of the same, in order to improve the production yield of OLED display devices.

In an aspect, an OLED display device is provided, which comprises a substrate, an OLED element on the substrate, and a packaging structure for the OLED element. A packaging cavity is formed between the packaging structure and the substrate, and the OLED element is located in the packaging cavity. The OLED display device further comprises a detection unit in the packaging cavity, and the detection unit has a chemical activity for oxygen not lower than that of the OLED element.

In another aspect, a method for detecting and repairing packaging effects for the OLED display device as described above is provided, the method comprising:

detecting the detection unit to determine whether the detection unit is eroded;

screening out an OLED display device having a packaging failure, in which the detection unit is eroded.

BRIEF DESCRIPTION OF DRAWINGS

The drawings illustrated here are used to provide further understanding to this disclosure and constitute part of this disclosure. The exemplary embodiments of this disclosure and depictions thereof are used to explain this disclosure, instead of unduly limiting the invention. In the drawings.

DETAILED DESCRIPTION OF EMBODIMENTS

At present, the detection of packaging effects of an OLED display device is usually performed by detecting an appearance of a packaging structure (e.g., a packaging cover plate and a sealant) of the OLED display device or an image quality of the OLED display device. For example, in case the packaging structure comprises a packaging cover plate and a sealant, an OLED display device having a packaging failure is screened out by detecting whether a projection width of the sealant of the OLED display device on the substrate satisfies a requirement or by detecting whether the image quality of the OLED display device is poor. However, both approaches to the detection of packaging effects of an OLED display device have low reliability and accuracy. For instance, during the detection of the projection width of the sealant of the OLED display device on the substrate, defects such as air holes and cracks in the packaging structure cannot be detected, and accordingly an OLED display device with a packaging failure caused by permeation of water and/or oxygen into the packaging cavity via defects such as air holes and cracks cannot be detected. During the detection of the image quality of the OLED display device, an OLED display device in which water and/or oxygen has slowly permeated into the packaging cavity despite the fact that the image quality is still good cannot be detected, i.e., an OLED display device having a slight packaging failure despite a good image quality cannot be detected. In other words, during the detection of the packaging effects of an OLED display device, neither of the existing approaches can detect an OLED display device with an inconspicuous packaging failure, which results in a low production yield of OLED display devices.

In order to further illustrate the OLED display device provided in the embodiments of this disclosure and the method for detecting and repairing the packaging effects of the same, detailed depictions will be provided below in combination with the drawings of the description. The reference signs in each drawing correspond to features as follows:

10—substrate,
20—OLED element,
30—packaging structure,
31—packaging cover plate,
32—sealant,
33—packaging failure portion,
40—packaging cavity,
50—detection unit,
51—OLED module,
52—eroded region,
53—non-eroded region,
60—repair unit,
61—packaging reinforcement unit,
70—display region,
80—non-display region.

Figure 1:
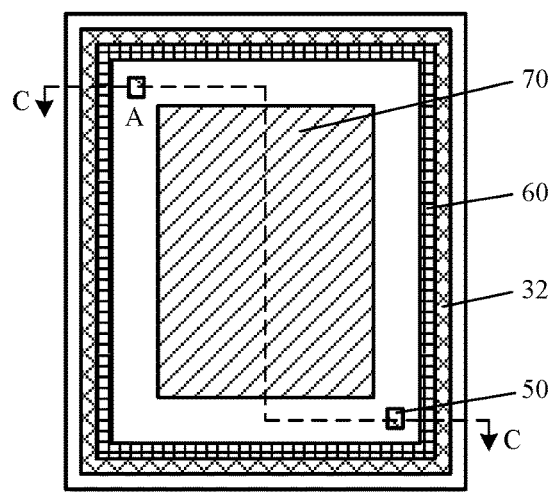
FIG. 1 is a schematic plan view of an OLED display device according to an embodiment of this disclosure.
Figure 2:
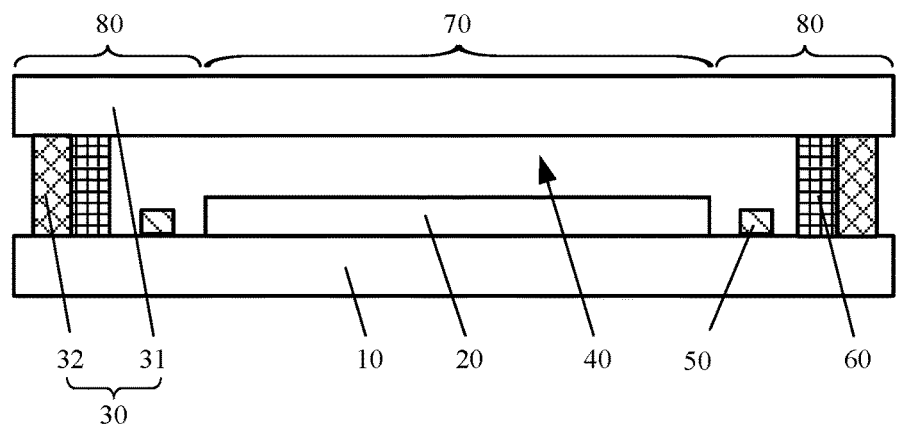
FIG. 2 is a section view obtained along dashed broken line C-C in FIG. 1.

Referring to FIG. 1 and FIG. 2, the OLED display device provided in the embodiments of this disclosure comprises a substrate 10, an OLED element 20 and a packaging structure 30. A packaging cavity 40 is formed between the packaging structure 30 and the substrate 10, and the OLED element 20 is located in the packaging cavity 40. The OLED display device further comprises a detection unit 50 in the packaging cavity 40. The detection unit 50 has a chemical activity for oxygen the same as that of the OLED element 20 or higher than that of the OLED element 20, i.e., the chemical activity of the detection unit for oxygen is not lower than that of the OLED element. Furthermore, in another embodiment, the chemical activity of the detection unit 50 for water is also not lower than that of the OLED element.

In the above embodiment, the OLED display device can be packaged in many ways, e.g., it can be packaged by conventional ways, by thin film packaging, by FRIT packaging or by dam&fill packaging. The packaging structure 30 usually comprises a packaging cover plate and a sealant, the packaging cover plate is opposite to the substrate 10, and the sealant is used for bonding the packaging cover plate and the substrate 10 together so as to package the OLED device 20 in the packaging cavity 40 jointly enclosed by the packaging cover plate, the substrate 10 and the sealant.

In the embodiments of this disclosure, an OLED display device packaged by FRIT packaging is exemplified.

Referring to FIG. 1 and FIG. 2, the OLED display device comprises a substrate 10, an OLED element 20 and a packaging structure 30, the OLED element 20 being located on the substrate 10. The packaging structure 30 comprises a packaging cover plate 31 and a sealant 32, the packaging cover plate 31 being opposite to the substrate 10. The sealant 32 may comprise frit or UV glue, and is located between the packaging cover plate 31 and the substrate 10. The sealant 32 bonds with the packaging cover plate 31 and the substrate 10 respectively, thereby bonding the packaging cover plate 31 and the substrate 10 together. The substrate 10, the packaging cover plate 31, and the sealant 32 jointly enclose a packaging cavity 40. In actual applications, the OLED display device comprises a display region 70 and a non-display region 80. The display region 70 corresponds to the OLED elements 20. The non-display region 80 surrounds the display region 70, and the sealant 32 is within the non-display region 80.

The OLED display device further comprises a detection unit 50 located in the packaging cavity 40. The detection unit 50 has a chemical activity for water and/or oxygen the same as that of the OLED element 20, or higher than that of the OLED element 20. In actual applications, within the OLED element 20, an organic light emitting layer of the OLED element 20 usually has the highest chemical activity for water and/or oxygen, i.e., the organic light emitting layer of the OLED element 20 is the most vulnerable to erosion by water and/or oxygen. Therefore, in the embodiments of this disclosure, the chemical activity of the detection unit 50 for water and/or oxygen is the same as that of the organic light emitting layer in the OLED element 20, or higher than that of the organic light emitting layer in the OLED element 20. In other words, the detection unit 50 is as vulnerable to erosion by water and/or oxygen as the organic light emitting layer in the OLED element 20, or more vulnerable than the organic light emitting layer in the OLED element 20.

When water and/or oxygen outside the OLED display device permeates into the packaging cavity 40 through the packaging structure 30, the detection unit 50 contacts water and/or oxygen and is eroded under the effect of water and/or oxygen. In this case, a portion of the detection unit 50 contacting water and/or oxygen will change in color or morphology, which can be detected or monitored for detecting the packaging effects of the OLED display device. For example, image information of a surface of the detection unit 50 (e.g., a surface of the detection unit 50 facing towards or away from the substrate 10) can be captured by using a microscope, a camera or the like, so as to determine whether the detection unit 50 is eroded based on the color, the morphology or the like of the detection unit 50 presented in the image information. Alternatively, it is detected by human eyes whether the detection unit 50 is eroded, thereby determining whether the packaging effect of the OLED display device is good and screening out an OLED display device having a packaging failure.

As can be seen, in the OLED display device provided in the embodiments of this disclosure, the detection unit 50 and the OLED element 20 are located in the same packaging cavity 40, and the chemical activity of the detection unit 50 for water and/or oxygen is not lower than that of the OLED element 20, so when water and/or oxygen outside the OLED display device permeates into the packaging cavity 40 through the packaging structure of the OLED display device, the detection unit 50 will be eroded under the effect of water and/or oxygen after contacting water and/or oxygen. To detect the packaging effects of the OLED display device, it is only necessary to detect the surface of the detection unit 50 in the packaging cavity 40 and determine whether the detection unit 50 is eroded, to determine whether the packaging effects of the OLED display device are good, thereby screening out an OLED display device with a packaging failure and intercepting it in the factory so as to improve the production yield of OLED display devices.

Besides, in the display device provided in the embodiments of this disclosure, the chemical activity of the detection unit 50 for water and/or oxygen is not lower than that of the OLED element, so when water and/or oxygen outside the OLED display device permeates into the packaging cavity 40 through the packaging structure of the OLED display device, the detection unit 50 will react to water and/or oxygen sensitively. As compared with the approach to the detection of the packaging effects of an OLED display device by detecting the appearance of the packaging structure of the OLED display device, this can detect an OLED display device having a packaging failure caused by other defects of the packaging structure despite a good appearance of the packaging structure. As compared with the approach to the detection of the packaging effects of an OLED display device by detecting the image quality of the OLED display device, this can detect an OLED display device having an inconspicuous packaging failure. For example, an OLED display device having a progressive packaging failure can be screened out, which can improve the accuracy and the reliability for the detection of the packaging effects of the OLED display device, and enhance the predictability of an OLED display device having a packaging failure.

In some embodiments, the chemical activity of the detection unit for oxygen is not lower than that of the OLED element, and furthermore, the chemical activity of the detection unit for water is not lower than that of the OLED element. That is, the sensitivity of the detection unit 50 to both water and oxygen is higher than that of the OLED element. As compared with a conventional way of arranging a desiccant in the packaging cavity 40 to detect the packaging effects of the OLED display device based on an expansion degree of the desiccant, this embodiment can detect simultaneously water and oxygen permeating into the packaging cavity, which improves the comprehensiveness of the detection of the packaging effects of the OLED display device.

Moreover, for the display device provided in the embodiments of this disclosure, the chemical activity of the detection unit 50 for water and/or oxygen is not lower than that of the OLED element 20, so when water and/or oxygen outside the OLED display device permeates into the packaging cavity 40 through the packaging structure of the OLED display device, the detection unit 50 will react to water and/or oxygen sensitively, thus, an OLED display device having a packaging failure will be screened out simply by checking the detection unit 50 in the packaging cavity 40 without detecting the OLED elements in the OLED display device one by one, which saves time for detecting the packaging effects of the OLED display device.

Figure 3:
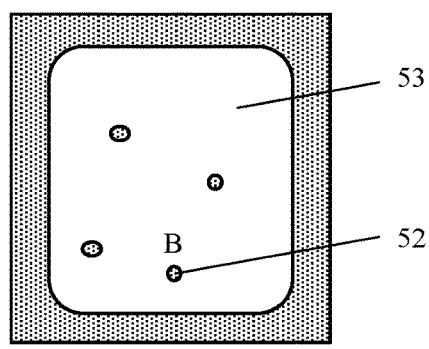
FIG. 3 is a schematic view of an image of a surface of the detection unit facing away from the substrate at position A in FIG. 1 according to an embodiment of this disclosure.

In the above embodiments, during the detection to the detection unit 50, an operation personnel or an automatic detection device can detect the detection unit 50 by using a microscope, a camera or the like to determine whether the detection unit 50 is eroded and determine whether the packaging of the OLED display device fails. For example, image information of a surface of the detection unit 50 in an OLED display device can be captured by using a microscope, a camera or the like, so as to determine based on the image information whether the detection unit 50 is eroded and determine whether the packaging of the OLED display device fails. For an OLED display device having a packaging failure, an erosion ratio of the detection unit 50 can be determined based on the image information of the surface of the detection unit 50. For example, referring to FIG. 3, FIG. 3 shows image information of a surface of the detection unit 50 facing away from the substrate 10 at position A in FIG. 1, i.e., image information of an upper surface of the detection unit 50 in FIG. 2. Based on the image information shown in FIG. 3, an erosion area of the detection unit 50 is acquired, which is then compared with an initial area of the detection unit 50 to obtain an erosion ratio of the detection unit 50. Then a packaging failure level of the OLED display device can be determined based on a screening standard for the OLED display device. For example, when the measured erosion ratio of the detection unit 50 is greater than 0% and smaller than or equal to 10%, the packaging failure level of the OLED display device is level 1. When the measured erosion ratio of the detection unit 50 is greater than 10% and smaller than or equal to 30%, the packaging failure level of the OLED display device is level 2. When the measured erosion ratio of the detection unit 50 is greater than 30% and smaller than or equal to 50%, the packaging failure level of the OLED display device is level 3.

For an OLED display device having a packaging failure, after the packaging failure level of the OLED display device is determined, it can be directly applied to an situation which is not demanding on the packaging effects of the OLED display device, i.e., the OLED display device having a packaging failure can be directly used with a degradation. Alternatively, the packaging structure 30 in the OLED display device having a packaging failure can be repaired and reinforced to prevent water and/or oxygen outside the OLED display device from continuously permeating into the packaging cavity 40 through the packaging structure 30, and then the OLED display device with a repaired and reinforced packaging structure 30 is used degradedly, which can decrease the reject rate of OLED display devices and reduce waste of resources.

When making a screening standard for the OLED display device, a relationship between the erosion ratio of the detection unit 50 and a lifespan of the OLED display device can be firstly established based on chemical properties of the detection unit 50. For example, when the erosion ratio of the detection unit 50 is greater than 0% and smaller than or equal to 10%, the lifespan of the OLED display device may reach LT95>200 h (the lifespan of the OLED display device is longer than 200 hours when the luminance of the OLED display device attenuates to 95%). When the erosion ratio of the detection unit 50 is greater than 10% and smaller than or equal to 30%, the lifespan of the OLED display device can reach LT95>100 h. When the erosion ratio of the detection unit 50 is greater than 30% and smaller than or equal to 50%, the lifespan of the OLED display device can reach LT95>75 h.

Thereafter, a screening standard for the OLED display device is established based on the relationship between the erosion ratio of the detection unit 50 and the lifespan of the OLED display device as well as a requirement for the lifespan of the OLED display device. For instance, the requirement of the lifespan of the OLED display device is LT95>200 h, i.e., an OLED display device with a lifespan reaching LT95>200 h is an OLED display device satisfying a factory requirement. In this case, the allowed erosion ratio of the detection unit 50 is greater than 0% and smaller than or equal to 10%, and OLED display devices in which the erosion ratio of the detection unit 50 is greater than 0% and smaller than or equal to 10% are OLED display devices satisfying the factory requirement but having a packaging failure, while OLED display devices in which the erosion ratio of the detection unit 50 is greater than 10% do not satisfy the factory requirement, i.e., OLED display devices in which the erosion ratio of the detection unit 50 is greater than 10% cannot leave the factory. Now, the packaging failure level of OLED display devices in which the erosion ratio of the detection unit 50 is greater than 0% and smaller than or equal to 10% can be graded as level 1, and the packaging failure level of OLED display devices in which the erosion ratio of the detection unit 50 is greater than 10% and smaller than or equal to 30% can be graded as level 2, and the packaging failure level of OLED display devices in which the erosion ratio of the detection unit 50 is greater than 30% and smaller than or equal to 50% can be graded as level 3. OLED display devices with a packaging failure level of level 1 are OLED display devices satisfying the factory requirement but having a packaging failure, i.e., OLED display devices with a packaging failure level of level 1 can leave the factory together with those in which the detection unit 50 is not eroded. OLED display devices with a packaging failure level of level 2 or level 3 are OLED display devices not satisfying the factory requirement, i.e., OLED display devices with a packaging failure level of level 2 or level 3 cannot leave the factory.

In case dotted erosions are indicated in image information of the surface of the detection unit 50, e.g., as shown at position B in FIG. 3, the number of the dotted erosions in the image information can be acquired. In this case, the screening standard for the OLED display device can be established based on the number of the dotted erosions on the surface of the detection unit 50, and then the packaging failure level of the OLED display device can be determined based on the screening standard for the OLED display device.

For example, assuming an OLED display device with a size of 5 inches, a plurality of 5-inch OLED display devices can be fabricated on a mother substrate board, and then individual OLED display devices can be obtained after slicing. The OLED display device is packaged by FRIT packaging. Referring to FIG. 1 and FIG. 2, the OLED display device comprises a substrate 10, an OLED element 20, a packaging structure 30 and a detection unit 50, the OLED element 20 and the detection unit 50 being both located on the substrate 10, and the OLED elements 20 correspond to a display region 70 of the OLED display device, and the detection unit 50 is within a non-display region 80 surrounding the display region 70. There are two detection units 50, which are located in two opposite corners outside the non-display region 70 respectively. The packaging structure 30 comprises a packaging cover plate 31 and a sealant 32, the packaging cover plate 31 being opposite to the substrate 10. The sealant 32 is located between the packaging cover plate 31 and the substrate 10. The OLED element 20 and the detection unit 50 are packaged in a packaging cavity 40 jointly by the packaging cover plate 31, the substrate 10, and the sealant 32. The detection unit 50 is a block-shaped detection unit located on the substrate 10, and it comprises a single Mg metal layer located on the substrate 10. An orthogonal projection of the detection unit 50 on the substrate 10 is a square with a side of 30 μm. A distance between the detection unit 50 and the sealant 32 can be set as 500 μm. The requirement of lifespan of the OLED display device may be LT95>100 h.

For an OLED display device adopting an RGB (Red, Green and Blue) color scheme, among the OLED elements 20, as compared with the organic light emitting layers corresponding to R pixels and B pixels, the organic light emitting layer corresponding to G pixels is the most sensitive to water and/or oxygen. In other words, the G pixels are more prone to be damaged by water and/or oxygen and retract therefor. As a result, the lifespan of the G pixels can be used as a standard for establishing the screening standard for the OLED display device.

From studies of the chemical properties of Mg metals, a great deal of experimental data is obtained by placing the OLED display device in an experimental environment with a temperature of 60 and a humidity of 90% and maintaining it there for 240 h. After analysis of the experimental data, it is concluded: when the erosion ratio of the detection unit 50 is smaller than or equal to 30%, i.e., the erosion area of the detection unit 50 is smaller than or equal to 30% of the initial area of the detection unit 50, the lifespan of the G pixels can reach LT95>100 h; when the erosion ratio of the detection unit 50 is greater than 30% and smaller than or equal to 40%, the lifespan of the G pixels can reach LT95>75 h; when the erosion ratio of the detection unit 50 is greater than 40% and smaller than or equal to 50%, the lifespan of the G pixels can reach LT95>50 h.

In other words, when the erosion ratio of the detection unit 50 is smaller than or equal to 30%, the lifespan of the OLED display device satisfies the lifespan requirement, i.e., the OLED display device satisfies the factory requirement but the packaging of the OLED display device fails, and the packaging failure level of these OLED display devices is graded as level 1. When the erosion ratio of the detection unit 50 is greater than 30%, the lifespan of the OLED display device does not satisfy the lifespan requirement, i.e., the OLED display device does not satisfy the factory requirement, and the packaging failure level of OLED display devices in which the erosion ratio of the detection unit 50 is greater than 30% and smaller than or equal to 40% can be graded as level 2, and the packaging failure level of OLED display devices in which the erosion ratio of the detection unit 50 is greater than 40% and smaller than or equal to 50% can be graded as level 3.

When checking the packaging effect of an OLED display device, the detection unit 50 may be firstly detected to determine whether the detection unit 50 is eroded. An OLED display device in which the detection unit 50 is not eroded is deemed as having a good packaging effect and can directly proceed to a next process or leave the factory. An OLED display device in which the detection unit 50 is eroded is screened out, i.e., an OLED display device having a packaging failure is screened out and then graded. The erosion ratio of the detection unit 50 in the OLED display device having a packaging failure can be acquired first, and then the packaging failure level of the OLED display device is determined based on the erosion ratio of the detection unit 50 and the screening standard for the OLED display device. For example, if the erosion ratio of the detection unit 50 falls within a range of 0% to 30%, the packaging failure level of the OLED display device is level 1. If the erosion ratio of the detection unit 50 falls within a range of 30% to 40%, the packaging failure level of the OLED display device is level 2. And if the erosion ratio of the detection unit 50 falls within a range of 40% to 50%, the packaging failure level of the OLED display device is level 3.

The material for the detection unit 50 can be selected upon actual needs. For example, for an OLED display device in which the OLED element 20 is more sensitive to water and less sensitive to oxygen, the material of the detection unit 50 can be a material satisfying a high sensitivity to water; for an OLED display device in which the OLED element 20 is more sensitive to oxygen and less sensitive to water, the material of the detection unit 50 can be a material satisfying a high sensitivity to oxygen; for an OLED display device in which the OLED element 20 is highly sensitive to both water and oxygen, the material of the detection unit 50 needs to be a material satisfying a high sensitivity to both water and oxygen.

Figure 4:
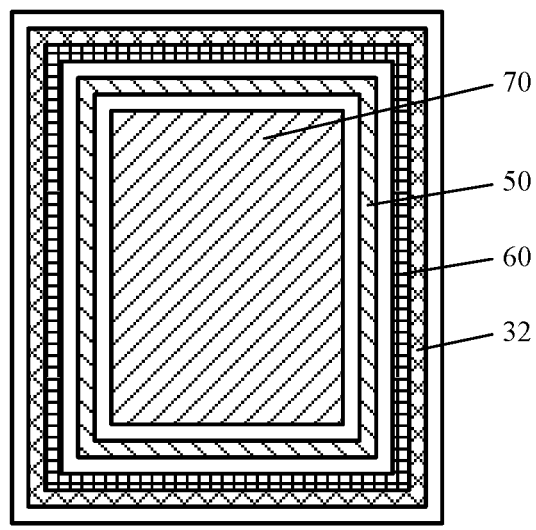
FIG. 4 is a schematic plan view of an OLED display device provided according to another embodiment of this disclosure.

Referring to FIG. 1 or FIG. 4, in another embodiment of this disclosure, the OLED display device comprises a display region 70 and a non-display region 80 surrounding the display region 70; a repair unit 60 is arranged in the non-display region 80 for repairing the packaging structure 30 upon detection of a packaging failure of the OLED display device by the detection unit 50.

In actual applications, the repair unit 60 can be an annular repair unit surrounding the display region 70. Alternatively, the repair unit 60 can comprise a plurality of strip-shaped repair sub-units, the plurality of strip-shaped repair sub-units jointly forming a ring. Alternatively, the repair unit 60 can be enclosed by a plurality of block-shaped repair sub-units, the plurality of block-shaped repair sub-units being evenly distributed in an annular trajectory surrounding the display region 70. In the embodiment shown in FIG. 1 of this disclosure, the repair unit 60 is an annular repair unit. An annular repair unit will be exemplified below in detail.

For example, referring to FIG. 1 and FIG. 2, the OLED display device is packaged by FRIT packaging, and the OLED display device comprises a substrate 10, an OLED element 20, a packaging structure 30 and a detection unit 50, the OLED element 20 being located on the substrate 10. The packaging structure 30 comprises a packaging cover plate 31 and a sealant 32, the packaging cover plate 31 being opposite to the substrate 10. The sealant 32 can be frit or UV glue, and is located between the packaging cover plate 31 and the substrate 10. The sealant 32 bonds with the packaging cover plate 31 and the substrate 10 respectively, thereby bonding the packaging cover plate 31 and the substrate 10 together. The substrate 10, the packaging cover plate 31, and the sealant 32 jointly enclose a packaging cavity 40 in which the OLED element 20 and the detection unit 50 are packaged. The OLED display device comprises a display region 70 and a non-display region 80. The display region 70 corresponds to the OLED elements 20. The non-display region 80 surrounds the display region 70, and the sealant 32 is within the non-display region 80.

During the detection of the packaging effect of an OLED display device, an operation personnel or an automatic detection device can detect the detection unit 50 first by using a microscope, a camera or the like to determine whether the detection unit 50 is eroded and screen out an OLED display device having a packaging failure in which the detection unit 50 is eroded.

After completion of the detection of the packaging effect of an OLED display device, the annular repair unit in an OLED display device having a packaging failure can be treated such that the annular repair unit melts in a special condition, for example, the annular repair unit is melt by a laser treatment, a UV treatment, an infrared treatment or a heating treatment so as to repair the packaging structure 30.

When preparing the packaging structure 30 by means of the annular repair unit, a packaging failure level of the OLED display device can be determined according to the erosion ratio of the detection unit 50 and the screening standard of the OLED display device. For an OLED display device satisfying the factory requirement but having a packaging failure (e.g., for an OLED display device with a packaging failure level of level 1, the OLED display device satisfies the factory requirement, but the detection unit 50 has been eroded, which indicates that water and/or oxygen has permeated into the packaging cavity 40 through the sealant 32, i.e., the sealant 32 has defects), the entire annular repair unit can be treated such that the entire annular repair unit melts in a special condition to form an annular reinforcement unit. The annular reinforcement unit is integrated with the sealant 32 to repair the sealant 32, thereby achieving repair of the packaging structure 30 by means of the annular repair unit and preventing water and/or oxygen outside the OLED display device from continuously permeating into the packaging cavity 40 through the packaging structure 30.

Figure 5:
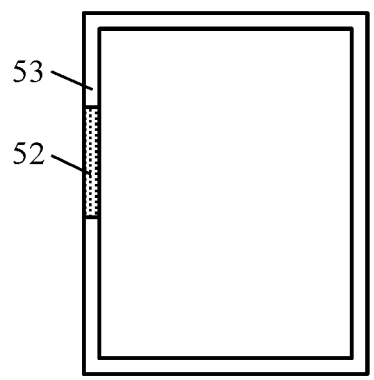
FIG. 5 is a schematic view of an image of a surface of the detection unit facing away from the substrate in FIG. 4.
Figure 6:
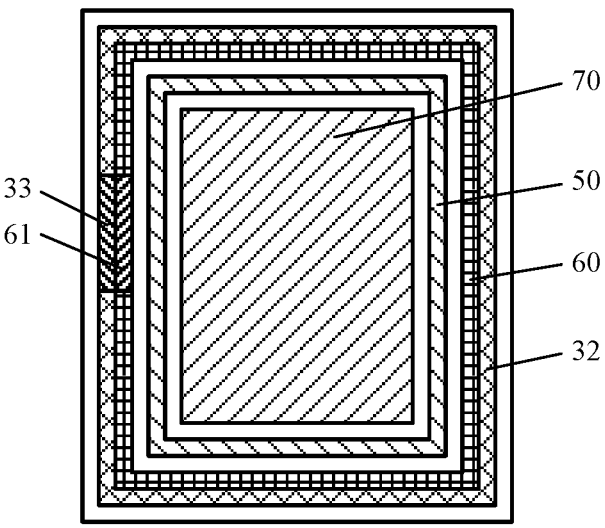
FIG. 6 is a schematic view of a packaging failure portion and a packaging reinforcement unit corresponding to FIG. 5.

In some embodiments, the detection unit 50 is an annular detection unit. The annular detection unit surrounds the display region 70 or is arranged along the periphery of the display region 70. In other embodiments, a plurality of block-shaped detection units may be evenly distributed in an annular trajectory surrounding the display region 70 or on the periphery of the display region 70. In these embodiments, a packaging failure portion 33 of the packaging structure 30 can be determined based on the image information of the surface of the entire detection unit 50. For example, FIG. 5 shows an example of image information of a surface of the detection unit 50 facing away from the substrate 10. As can be seen from FIG. 5, a portion 52 of the detection unit 50 in FIG. 5 is eroded. Referring to FIG. 6, according to the image information of the surface of the detection unit 50 as shown in FIG. 5, it can be determined that the portion of the sealant 32 corresponding to an eroded portion of the detection unit 50 in FIG. 4 is the packaging failure portion 33. After determination of the packaging failure portion 33 of the sealant 32, the portion of the annular repair unit 60 corresponding to the packaging failure portion 33 is treated such that the portion of the annular repair unit corresponding to the packaging failure portion 33 forms a packaging reinforcement unit 61. The annular reinforcement unit 61 is integrated with the packaging failure portion 33 to repair the packaging failure portion 33, thereby preventing water and/or oxygen outside the OLED display device from continuously permeating into the packaging cavity 40 through the packaging failure portion 33.

By repairing the packaging structure 30 using the repair unit 60, the packaging effect of an OLED display device satisfying the factory requirement but having a packaging failure can be improved and a rapidly shortened lifespan of the OLED display device satisfying the factory requirement but having a packaging failure is prevented in use, which can improve the quality of the OLED display device and reduce the user's complaints.

For an OLED display device not satisfying the factory requirement, e.g., an OLED display device with a packaging failure level of level 2 or level 3, in case the repair unit 60 is an annular repair unit surrounding the display region 70, the entire annular repair unit can be treated such that the entire annular repair unit melts in a special condition to form an annular reinforcement unit. The annular reinforcement unit is integrated with the sealant 32 to repair the sealant 32, thereby achieving repair of the packaging structure 30 by using the annular repair unit and preventing water and/or oxygen outside the OLED display device from continuously permeating into the packaging cavity 40 through the packaging structure 30.

By repairing the packaging structure 30 using the repair unit 60, the packaging effects of an OLED display devices having a packaging defect are improved so that the OLED display device not satisfying the factory requirement can be used degradedly, which decreases the reject rate of OLED display devices and reduces waste of resources.

Before the packaging structure 30 of the OLED display device is repaired, it can be determined based on the packaging failure level of the OLED display device and a repair standard for the OLED display device whether the packaging structure 30 of the OLED display device will be repaired. For example, for an OLED display device with a packaging failure level of level 3, when it is determined based on the repair standard for the OLED display device that the packaging structure 30 of the OLED display device will not be repaired, the OLED display device can be directly rejected so as to prevent an increase in the production cost of the OLED display device caused by repairing the packaging structure 30 of the OLED display device.

When establishing the repair standard for the OLED display device, the following factors can be taken into consideration: the packaging failure level of the OLED display device, the time interval between the detection of the packaging effect of the OLED display device and the repair of the packaging structure 30 of the OLED display device, and the repair process for repairing the packaging structure 30 of the OLED display device, and the repair standard for the OLED display device can be established based thereon.

In the embodiment, the repair unit 60 is located in the non-display region 80. In specific implementation, the repair unit 60 can be arranged either inside the packaging cavity 40 or outside the packaging cavity 40. That is, the repair unit 60 can be arranged either inside the sealant 32 or outside the sealant 32. In the embodiment of this disclosure, the repair unit 60 is located inside the packaging cavity 40. When the repair unit 60 is an annular repair unit, the detection unit 50 is located inside the annular repair unit. For example, referring to FIG. 1 to FIG. 4, the packaging structure 30 comprises a packaging cover plate 31 and a sealant 32, the packaging cover plate 31 being opposite to the substrate 10. The sealant 32 is between the packaging cover plate 31 and the substrate 10. The substrate 10, the packaging cover plate 31, and the sealant 32 jointly form a packaging cavity 40. The OLED element 20 is arranged on the substrate 10, and the OLED element 20 is located inside the packaging cavity 40. The OLED display device comprises a display region 70 and a non-display region 80. The display region 70 corresponds to the OLED elements 20, and the non-display region 80 surrounds the display region 70. The sealant 32 is located in the non-display region 80 and surrounds the display region 70. The repair unit 60 is located inside the packaging cavity 40, and the repair unit 60 is an annular repair unit surrounding the display region 70 and the detection unit 50.

The repair unit 60 is inside the packaging cavity 40. When the repair unit 60 is treated to repair the packaging structure 30, the repair unit 60 forms a packaging reinforcement unit for repairing and reinforcing the packaging structure 30 inside the packaging cavity 40 such that water and/or oxygen left in the packaging structure 30 can be isolated outside the packaging cavity 40, which prevents water and/or oxygen left in the packaging structure 30 from permeating into the packaging cavity 40 and reduces the risk that the OLED element 20 contacts water and/or oxygen.

In the above embodiments, there can be multiple choices for the material of the repair unit 60. For example, the material of the repair unit 60 can be frit or a polymer precursor, which may be melted and cured after a laser treatment, a UV treatment, an infrared treatment or a heating treatment, and integrated with the packaging structure 30, thereby functioning to repair the packaging structure 30. In actual applications, the material of the repair unit 60 can also be other materials having a high water blocking capability, oxygen blocking capability or water and oxygen blocking capability after treatment.

During the treatment of the repair unit 60 for melting the repair unit 60 in a special condition to repair the packaging structure 30, the process for treating the repair unit 60 can be determined based on the material of the repair unit 60.

For the embodiments provided in this disclosure, the OLED display device comprises a display region 70 and a non-display region 80, the non-display region 80 surrounding the display region 70. The detection unit 50 and the OLED element 20 are inside the same packaging cavity 40, and the detection unit 50 can be located within either the non-display region 80 or the display region 70. Explanations will be given below with reference to specific examples, but this invention is not limited to the specific examples.

Referring to FIG. 1, FIG. 2 and FIG. 4, the OLED display device comprises a display region 70 and a non-display region 80 surrounding the display region 70, and the detection unit 50 is located within the non-display region 80. Arranging the detection unit 50 within the non-display region 80 can prevent the detection unit 50 from blocking the light from the display region 70.

When the detection unit 50 is arranged within the non-display region 80, referring to FIG. 2, the detection unit 50 can be arranged on a surface of the substrate 10 provided with the OLED element 20. Specifically, the OLED display device as shown in FIG. 1 and FIG. 2 is exemplified. The OLED display device comprises a substrate 10, an OLED element 20, a packaging structure 30 and a detection unit 50, the OLED element 20 and the detection unit 50 being both located on an upper surface of the substrate 10 in FIG. 2. The packaging structure 30 comprises a packaging cover plate 31 and a sealant 32, the packaging cover plate 31 being located above the substrate 10 in FIG. 2. The sealant 32 is located between the substrate 10 and the packaging cover plate 31, and the sealant 32 bonds with the substrate 10 and the packaging cover plate 31 respectively, thereby encapsulating the OLED element 20 and the detection unit 50 inside a packaging cavity 40 jointly enclosed by the substrate 10, the packaging cover plate 31, and the sealant 32.

In the OLED display device, the OLED element 20 usually comprises two electrodes and an organic light emitting layer, the organic light emitting layer being located between the two electrodes, the two electrodes and the organic light emitting layer constituting a sandwich structure. One of the electrodes of the OLED element 20 can be a metal electrode. In case the detection unit 50 is formed of a metal material, the detection unit 50 and the metal electrode of the OLED element 20 can be formed in one patterning process. For example, during the formation of the metal electrode and the detection unit 50, a metal layer of electrode can be deposited first, and then a metal layer of detection unit is deposited. After that, a mask is used to perform patterning to obtain the metal electrode and the detection unit 50, thereby achieving formation of the metal electrode and the detection unit 50 in one patterning process. Alternatively, when the metal electrode and the detection unit 50 are made of a same metal, a metal layer can be deposited first, and then a mask is used to perform patterning to form the metal electrode and the detection unit 50 at the same time, thereby achieving formation of the metal electrode and the detection unit 50 in one patterning process.

When the detection unit 50 is a metal detection unit, forming the detection unit 50 and the metal electrode of the OLED element 20 in one patterning process can reduce steps for fabricating the OLED display device, save time and decrease the number of masks used and thus cut down the cost.

Figure 7:
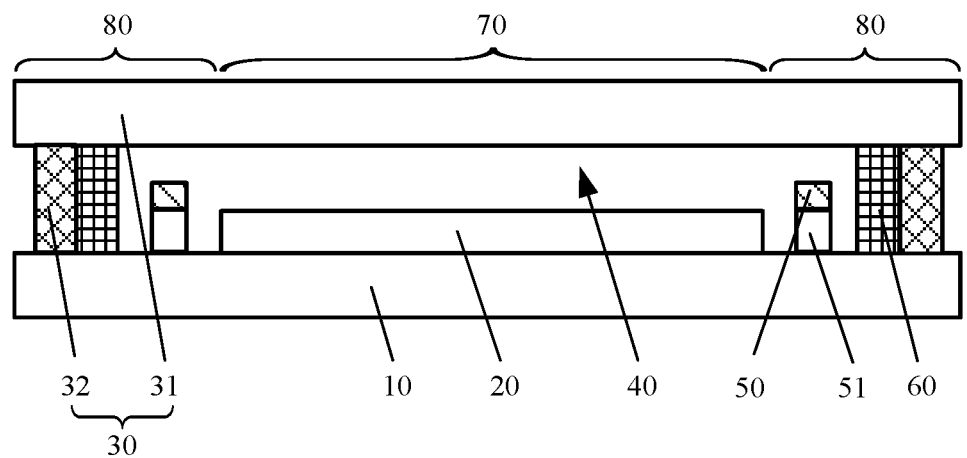
FIG. 7 is a schematic view of an image of a surface of the detection unit facing away from the substrate at position A in FIG. 1 according to another embodiment of this disclosure.

Referring to FIG. 7, in another embodiment, the OLED display device further comprises an OLED module 51, the OLED module 51 being arranged in a region of the substrate 10 corresponding to the non-display region 80. The OLED module 51 is connected with a drive circuit of the OLED display device and configured for simulating an operational state of the OLED element 20. The detection unit 50 is located on a surface of the OLED module 51 facing away from the substrate 10. An OLED module 51 is arranged in a region of the substrate 10 corresponding to the non-display region 80, the OLED module 51 having the same structure as the OLED element 20. The OLED module 51 is connected with a drive circuit of the OLED display device. Thus, when the OLED display device operates, the OLED module 51 also operates and generates light and heat. The detection unit 50 is arranged on a surface of the OLED module 51 facing away from the substrate 10, so when the OLED display device operates, the detection unit 50 will also be influenced by the light and heat generated by the OLED module 51.

Usually, when the OLED display device operates, the OLED element 20 generates light and heat, so when water and/or oxygen outside the OLED display device permeates into the packaging cavity 40 through the packaging structure 30, the OLED element 20 will be influenced by light and heat as well as water and/or oxygen. That is, the operational environment of the OLED element 20 is usually very complicated such that the OLED element 20 is more prone to be eroded by water and/or oxygen.

Therefore, an OLED module 51 is arranged in a region of the substrate 10 corresponding to the non-display region 80, and the OLED module 51 is connected with a drive circuit of the OLED display device, the detection unit 50 is arranged on a surface of the OLED module 51 facing away from the substrate 10. When the OLED display device operates, the OLED module 51 generates light and heat and is configured for simulating the operational state of the OLED element 20. The detection unit 50 can be influenced by the light and heat generated by the OLED module 51. When water and/or oxygen outside the OLED display device permeates into the packaging cavity 40 through the packaging structure 30, the detection unit 50 will be influenced by light and heat as well as water and/or oxygen. In other words, when the OLED display device operates, the environment in which the detection unit 50 is located can approximate to the environment in which the OLED element 20 is located, or the environment in which the detection unit 50 is located is the same as the environment in which the OLED element 20 is located. Accordingly, when the detection unit 50 is detected, the detection result can accurately reflect the operational state of the OLED element 20, help to understand the influence by water and/or oxygen on the OLED element 20 during operation, which further improves the production yield of the OLED display device.

In all of the above embodiments, the detection unit 50 is arranged on a side of the substrate 10 facing towards the packaging structure 30. In actual applications, when the packaging structure 30 of the OLED display device comprises a packaging cover plate 31 opposite to the substrate 10, the detection unit 50 can be arranged on a surface of the packaging cover plate 31 facing towards the substrate 10.

There can be various structures for the detection unit 50. For example, referring to FIG. 1, the detection unit 50 can be a block-shaped, and the section of the detection unit 50 may be in the shape of a rectangle, a circle or the like. When the detection unit 50 is a block-shaped, the number of the detection units 50 can be one or more. When the number of detection units 50 is more than one, the more than one detection unit 50 is uniformly distributed surrounding the display region 70. For example, as shown in FIG. 1, the number of the detection units 50 is two and the section of the display region 70 of the OLED display device is in the shape of a rectangle, the two detection units 50 can be located on a pair of corners outside of the display region 70 respectively.

Alternatively, referring to FIG. 4, the detection unit 50 can be an annular detection unit, and the detection unit 50 is arranged surrounding the display region 70. In this case, the detection unit 50 can detect water and/or oxygen permeating through each portion of the packaging structure 30 surrounding the OLED element 20 so as to confirm the packaging failure portion 33 of the packaging structure 30 and facilitate repair to the packaging failure portion 33 of the packaging structure 30. Besides, the detection unit 50 surrounds the display region 70, i.e., the detection unit 50 surrounds the OLED element 20, so when water and/or oxygen outside the OLED display device permeates into the packaging cavity 40 through the packaging structure 30, water and/or oxygen will first contact the detection unit 50, which can decrease the amount of water and/or oxygen directly contacting the OLED element 20 and reduce the risk that the OLED element 20 is eroded. The section view corresponding to the OLED display device shown in FIG. 4 can refer to the section view of the OLED display device shown in FIG. 2. The detection unit 50 can also be a strip-shaped.

The above embodiment indicates that the detection unit 50 can be arranged in the non-display region 80 of the OLED display device. In other embodiments, the detection unit 50 can also be arranged in the display region 70 of the OLED display device.

Figure 8:
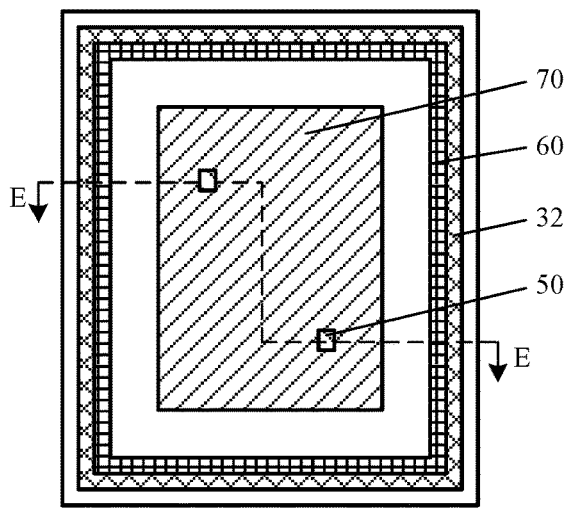
FIG. 8 is a schematic plan view of an OLED display device provided according to another embodiment of this disclosure.
Figure 9:
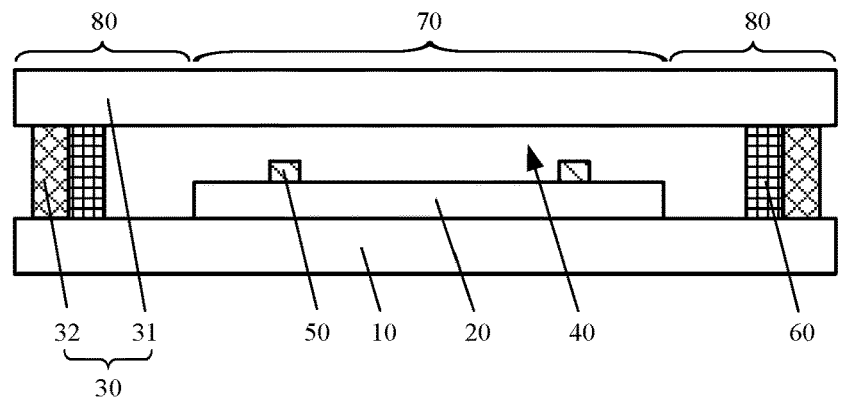
FIG. 9 is a section view obtained along dashed broken line E-E in FIG. 8.

Referring to FIG. 8 and FIG. 9, the OLED display device provided in the embodiment of this disclosure comprises a display region 70 and a non-display region 80 surrounding the display region 70. The display region 70 comprises a plurality of pixel units arranged in an array; the detection unit 50 is arranged within a non-light transmittance region of the display region 70. By arranging the detection unit 50 in the display region 70, a degree of erosion of the OLED element 20 can be detected by means of the detection unit 50, which helps to know a degree of damage of the OLED element 20 in the display region 70.

Besides, the detection unit 50 is arranged in a non-light transmittance region of the display region 70, so an orthogonal projection of the detection unit 50 on the substrate 10 does not overlap that of the pixel unit on the substrate 10. When the OLED display device operates, the detection unit 50 will not block light emitted from the display region 70.

In the embodiments shown in FIG. 8 and FIG. 9, the detection unit 50 is arranged within the display region 70. The detection unit 50 can be arranged on a side of the substrate 10 facing towards the packaging structure 30. In this case, the OLED display device may further comprise a protection layer (not shown) covering the OLED element 20, and the detection unit 50 is located on the protection layer.

When the packaging structure 30 of the OLED display device comprises a packaging cover plate 31 opposite to the substrate 10, the detection unit 50 can also be arranged on a surface of the packaging cover plate 31 facing towards the substrate 10.

In case the detection unit 50 is arranged in the display region 70, there can be various structures for the detection unit 50. For example, the detection unit 50 can be strip-shaped detection unit, or an annular detection unit, or a block-shaped detection.

The number of the detection units 50 can also be determined upon actual needs. For example, the number of the detection units 50 can be one, and in this case the detection unit 50 can correspond to a central part of the display region 70. Alternatively, the number of the detection units 50 can be more than one, and in this case, the more than one detection unit 50 can be uniformly distributed in the display region 70.

In the above embodiments, the detection unit 50 can be formed by at least one layered structure. For example, the detection unit 50 can be formed by only one layered structure, i.e., during the fabrication of the detection unit 50, only one detection unit layer needs to be formed. Alternatively, the detection unit 50 may comprise multiple layered structures, i.e., during the fabrication of the detection unit 50, multiple detection unit layers need to be formed.

There can be multiple choices for the material of the detection unit 50. For example, the material of the detection unit 50 can be metals such as magnesium (Mg), aluminum (Al), and so on.

The material of the detection unit 50 can also be organic materials, the sensitivity of the organic materials to water being higher than or equal to that of the organic light emitting layer of the OLED element 20, or the sensitivity of the organic materials to oxygen being higher than or equal to that of the organic light emitting layer of the OLED element 20, or the sensitivity of the organic materials to both water and oxygen being higher than or equal to that of the organic light emitting layer of the OLED element 20.

In some embodiments, the material of the detection unit 50 can also be fluorescent probe molecules.

In the above embodiments, the detection unit 50 can be fabricated by an evaporation process or an inkjet printing process.

In the OLED display device provided in this disclosure, the detection unit and the OLED element are located in the same packaging cavity, and the detection unit has a chemical activity for oxygen not lower than that of the OLED element. Furthermore, the chemical activity of the detection unit for water can be also not lower than that of the OLED element. Therefore, when water and/or oxygen outside the OLED display device permeates into the packaging cavity through the packaging structure of the OLED display device, the detection unit will be eroded under the effect of water and/or oxygen after contacting water and/or oxygen. In order to judge the packaging effect of the OLED display device, it is only necessary to detect the detection unit in the packaging cavity and determine whether the detection unit is eroded or determine whether water and/or oxygen permeates into the packaging cavity based on erosion conditions of the detection unit, so as to detect whether the packaging effect of the OLED display device is good, thereby screening out an OLED display device with a packaging failure and intercepting it in the factory to improve the production yield of OLED display devices.

Figure 10:
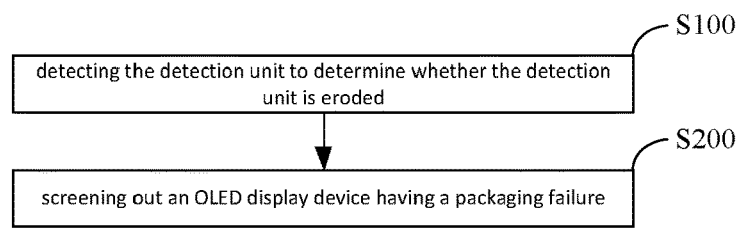
FIG. 10 is a flow diagram of a method for detecting and repairing packaging effects for an OLED display device according to an embodiment of this disclosure.

Referring to FIG. 10, another embodiment of this disclosure further provides a method for detecting and repairing packaging effects of an OLED display device, in order to service the OLED display device mentioned in the above embodiments, the method for detecting and repairing packaging effect of an OLED display device comprising:

Step S100, detecting the detection unit to determine whether the detection unit is eroded;

Step S200, screening out an OLED display device having a packaging failure, in which the detection unit is eroded.

In an embodiment, during detection of the packaging effect of an OLED display device, an automatic detection machine or an operation personnel can observe a surface of the detection unit first by using a microscope, a camera or the like, for example, observe changes in color, morphology and so on of the surface of the detection unit to determine whether the detection unit is eroded. If it is determined that the detection unit is eroded, which indicates a packaging failure of the OLED display device, screen out the OLED display device having a packaging failure to prevent it from leaving the factory.

The embodiments in the description are described in a progressive manner, and same or similar portions between the embodiments can refer to each other, and each embodiment emphasizes differences from other embodiments. In particular, for the method embodiments, the basic principles thereof are similar to those of the device embodiments, so they are described in a concise manner, and content of the device embodiments can be referred to for related portions.

In the above embodiments, the detection of the detection unit can be carried out in a following manner: an operation personnel or an automatic detection machine observes the detection unit first by using a microscope, a camera or the like, to determine whether the detection unit is eroded and whether the packaging of the OLED display device fails, and then uses image information of the surface of the detection unit in the OLED display device having a packaging failure captured by the microscope, the camera or the like to facilitate determination of a failure level of the OLED display device and of a packaging failure portion of the packaging structure. Alternatively, an operation personnel or an automatic detection machine may use a microscope, a camera or the like to capture image of the surface of the detection unit, and determine whether the detection unit is eroded based on the image information and determine a failure level of the OLED display device and a packaging failure portion of the packaging structure.

Figure 11:
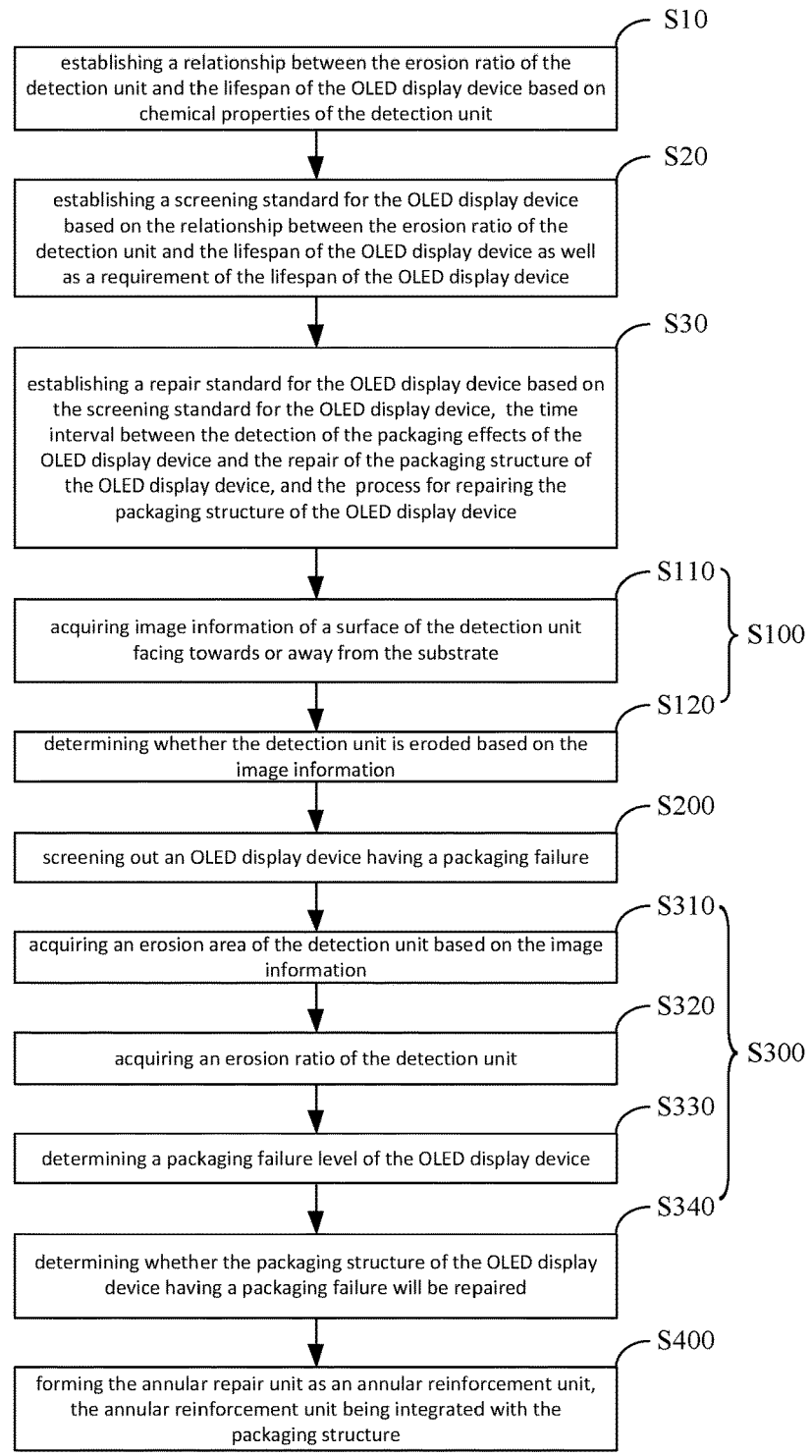
FIG. 11 is a flow diagram of a method for detecting and repairing packaging effects for an OLED display device according to another embodiment of this disclosure.

In an embodiment of this disclosure, the detection unit is detected in the latter manner. Referring to FIG. 11, the step S100 of detecting the detection unit to determine whether the detection unit is eroded may comprise the following steps.

S110, acquiring image information of a surface of the detection unit facing towards or away from the substrate;

S120, determining whether the detection unit is eroded based on the image information.

During the detection to the detection unit, an automatic detection machine or an operation personnel can use a microscope, a camera or the like to capture an image of a surface of the detection unit facing away from the substrate or an image of a surface of the detection unit facing towards the substrate, and then determine whether the detection unit is eroded based on the image information of the surface of the detection unit. For example, it can be determined whether the detection unit is eroded based on changes in color, morphology and so on of the detection unit presented in the image of the surface of the detection unit, thereby determining whether the packaging of the OLED display device fails.

Referring continuously to FIG. 11, in an embodiment of this disclosure, the OLED display device comprises a display region and a non-display region surrounding the display region, the non-display region being provided with an annular repair unit surrounding the display region. The method for detecting and repairing packaging effect of an OLED display device further comprises the following steps after the step S200 of screening out the OLED display device having a packaging failure.

Step S300, determining whether the packaging structure of the OLED display device having a packaging failure will be repaired;

Step S400, if it is determined to repair the packaging structure of the OLED display device having a packaging failure, forming the annular repair unit as an annular reinforcement unit, the annular reinforcement unit being integrated with the packaging structure.

Specifically, after completion of the detection of the packaging effect of the OLED display device, for an OLED display device having a packaging failure, it can be evaluated first to determine whether the packaging structure of the OLED display device having a packaging failure will be repaired. When it is to be repaired, the annular repair unit is treated, for example, by a laser treatment, a UV treatment, an infrared treatment or a heating treatment such that the annular repair unit melts to form an annular reinforcement unit. The annular reinforcement unit is integrated with the packaging structure, and thereby the packaging structure of the OLED display device having a packaging failure is repaired.

Figure 12:
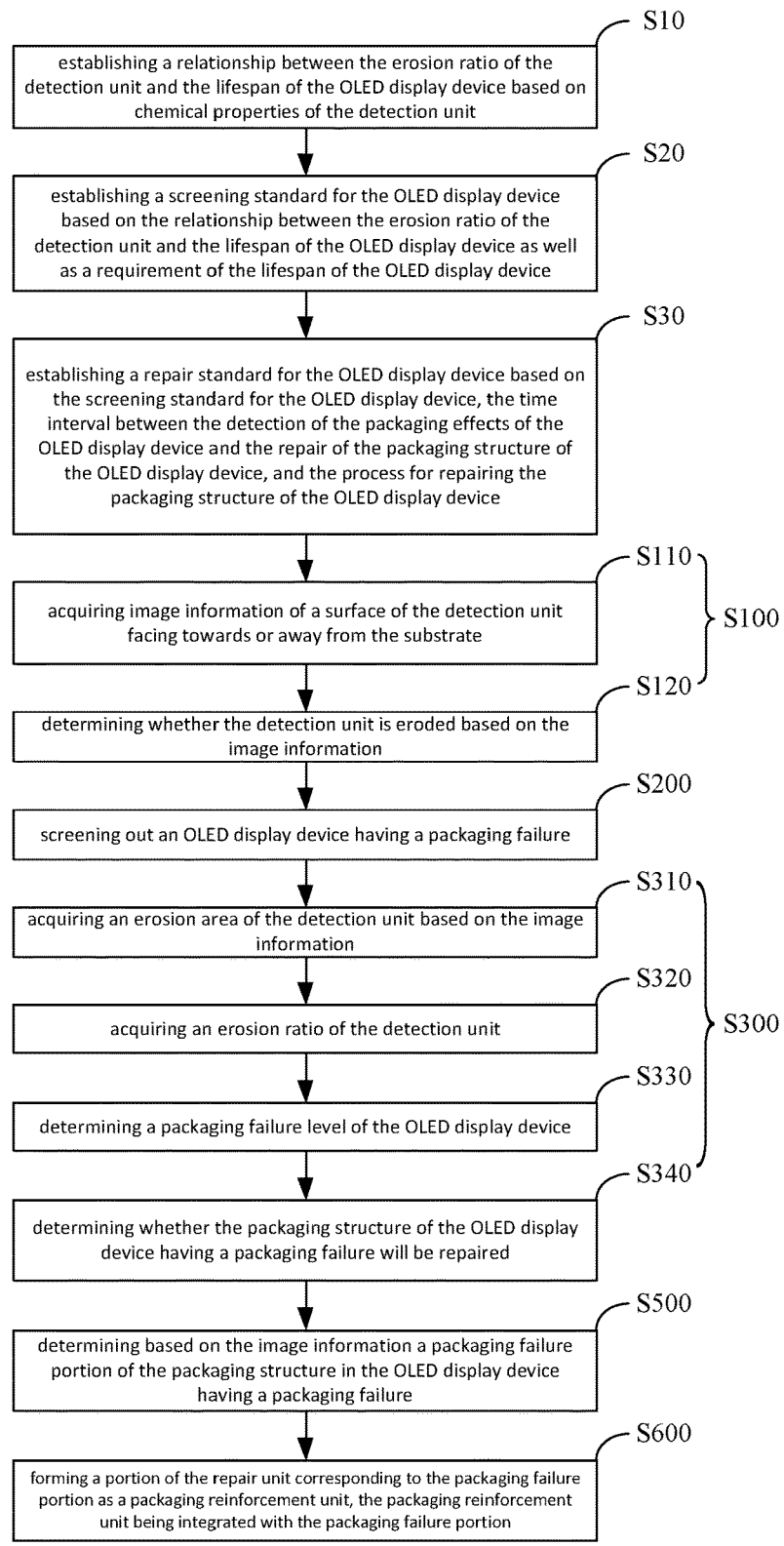
FIG. 12 is a flow diagram of a method for detecting and repairing packaging effects for an OLED display device according to yet another embodiment of this disclosure.

Alternatively, in another embodiment, referring to FIG. 12, after the step S200 of screening out the OLED display device having a packaging failure, the method for detecting and repairing packaging effect of an OLED display device further comprises:

Step S300, determining whether the packaging structure of the OLED display device having a packaging failure will be repaired;

Step S500, when repairing the packaging structure of the OLED display device having a packaging failure, determining based on the image information a packaging failure portion of the packaging structure in the OLED display device having a packaging failure;

Step S600, forming a portion of the repair unit corresponding to the packaging failure portion as a packaging reinforcement unit, the packaging reinforcement unit being integrated with the packaging failure portion.

After completion of the detection to the packaging effect of the OLED display device, for an OLED display device having a packaging failure, it can be evaluated first to determine whether the packaging structure of the OLED display device having a packaging failure will be repaired. When the answer is YES, a packaging failure portion of the packaging structure in the OLED display device having a packaging failure is determined based on image information of a surface of the detection unit facing towards or away from the substrate; and then a portion of the repair unit corresponding to the packaging failure portion is treated, for example, by a laser treatment, a UV treatment, an infrared treatment or a heating treatment, such that the portion of the repair unit corresponding to the packaging failure portion melts to form a packaging reinforcement unit. The packaging reinforcement unit is integrated with the packaging failure portion, and thereby the packaging structure of the OLED display device having a packaging failure is repaired.

After a packaging failure portion of the packaging structure in the OLED display device having a packaging failure is determined, a portion of the repair unit corresponding to the packaging failure portion is treated to form a packaging reinforcement unit. The packaging reinforcement unit is integrated with the packaging failure portion, thereby the packaging structure of the OLED display device having a packaging failure is repaired. As compared with the approach of repairing the packaging structure of the OLED display device having a packaging failure by treating the entire repair unit, this method can save the time for repairing the packaging structure of the OLED display device having a packaging failure and cut down the cost of repair.

Referring continuously to FIG. 11 or FIG. 12, step S300 of determining whether the packaging structure of the OLED display device having a packaging failure will be repaired comprises:

Step S310, acquiring an erosion area of the detection unit based on the image information;

Step S320, acquiring an erosion ratio of the detection unit based on the erosion area of the detection unit and an initial area of the detection unit;

Step S330, determining a packaging failure level of the OLED display device based on the erosion ratio of the detection unit and a screening standard for the OLED display device;

Step S340, determining based on the packaging failure level of the OLED display device and a repair standard for the OLED display device whether the packaging structure of the OLED display device having a packaging failure will be repaired.

In actual applications, upon a determination that the detection unit is eroded, i.e., the packaging of the OLED display device fails, OLED display devices having a packaging failure are screened out. The OLED display devices having a packaging failure comprise OLED display devices satisfying the factory requirement and those not satisfying the factory requirement. The lifespan of the OLED display devices satisfying the factory requirement can reach the lifespan requirement, and the lifespan of the OLED display devices not satisfying the factory requirement cannot reach the lifespan requirement.

For an OLED display device satisfying the factory requirement, the step of repairing the packaging structure can be carried out completely, i.e., the packaging structure of an OLED display device satisfying the factory requirement but having a packaging failure is repaired to prevent water and/or oxygen outside the OLED display device from continuously permeating into the packaging cavity through the packaging structure, thereby preventing a sudden decrease in the image quality of the OLED display device caused by continuous permeation of water and/or oxygen into the packaging cavity through the packaging structure during usage of the OLED display device and reducing complaints from the user.

For an OLED display device not satisfying the factory requirement, it can be determined based on the packaging failure level of the OLED display device and the repair standard of the OLED display device whether the packaging structure of the OLED display device not satisfying the factory requirement will be repaired. For example, if after the packaging structure of the OLED display device is repaired, the image quality of the OLED display device satisfies the requirement of a degraded product, i.e., the OLED display device can be used with degradation after the packaging structure thereof is repaired, the packaging structure of the OLED display device can be repaired; if after the packaging structure of the OLED display device is repaired, the image quality of the OLED display device does not satisfy the requirement of a degraded product, i.e., the OLED display device cannot be used with degradation after the packaging structure thereof is repaired, the OLED display device can be directly rejected.

Referring continuously to FIG. 11 or FIG. 12, prior to the step S100 of detecting the detection unit to determine whether the detection unit is eroded, the method for detecting and repairing packaging effects of an OLED display device provided in the embodiment of this disclosure further comprises:

Step S10, establishing a relationship between the erosion ratio of the detection unit and the lifespan of the OLED display device based on chemical properties of the detection unit;

Step S20, establishing a screening standard for the OLED display device based on the relationship between the erosion ratio of the detection unit and the lifespan of the OLED display device as well as a requirement of the lifespan of the OLED display device.

Referring continuously to FIG. 11 or FIG. 12, prior to the step S100 of detecting the detection unit to determine whether the detection unit is eroded, the method for detecting and repairing packaging effects of an OLED display device provided in the embodiments of this disclosure further comprises:

Step S30, establishing a repair standard for the OLED display device based on the screening standard for the OLED display device, the time interval between the detection of the packaging effects of the OLED display device and the repair of the packaging structure of the OLED display device, and the process for repairing the packaging structure of the OLED display device.

What have been discussed above is only specific embodiments of this disclosure, but the scope of the invention shall not be limited thereto. Any variant or substitution easily conceivable for a skilled person familiar with this art within the technical scope of this disclosure shall fall within the scope of the invention. Therefore, the scope of the invention should be subject to the scope of the claims.

The invention claimed is:

1. An OLED display device comprising a substrate, an OLED element and a packaging structure,
   wherein a packaging cavity is formed between the packaging structure and the substrate, and the OLED element is located in the packaging cavity,
   wherein the OLED display device further comprises a detection unit, the detection unit being located in the packaging cavity and having a chemical activity for oxygen higher than that of the OLED element, so as to estimate a packaging effect of the OLED display device through determining whether the detection unit is eroded,
   wherein the OLED display device comprises a display region and a non-display region surrounding the display region,
   wherein a repair unit is arranged in the non-display region and configured for repairing the packaging structure upon detection of a packaging failure of the OLED display device by the detection unit.

2. The OLED display device according to claim 1, wherein the detection unit has a chemical activity for water higher than that of the OLED element.

3. The OLED display device according to claim 2, wherein the detection unit has a chemical activity for oxygen higher than that of an organic light emitting layer in the OLED element, and the detection unit has a chemical activity for water higher than that of the organic light emitting layer in the OLED element.

4. The OLED display device according to claim 1, wherein for an OLED display device determined to have a packaging failure, the repair unit is treated to form a reinforcement unit integrated with the packaging structure, thereby repairing the packaging structure.

5. The OLED display device according to claim 4, wherein the packaging structure comprises a sealant and a packaging cover plate opposite to the substrate, and the sealant is used for bonding the packaging cover plate and the substrate together, the reinforcement unit formed from the repair unit being integrated with the sealant.

6. The OLED display device according to claim 5, wherein the repair unit is an annular repair unit surrounding the display region, wherein the annular repair unit is located in the packaging cavity, and the detection unit is located inside the annular repair unit.

7. The OLED display device according to claim 6, wherein the detection unit is an annular detection unit surrounding the display region, and wherein for an OLED display device determined to have a packaging failure, a portion of the annular repair unit corresponding to a packaging failure portion is treated to form the packaging reinforcement unit integrated with the packaging failure portion, the packaging failure portion being a portion of the sealant corresponding to an eroded part of the detection unit.

8. The OLED display device according to claim 1, wherein the repair unit is made of frit or a polymer precursor.

9. The OLED display device according to claim 1, wherein the OLED display device comprises a display region and a non-display region surrounding the display region, the detection unit is located within the non-display region.

10. The OLED display device according to claim 9, wherein the detection unit is located on a surface of the substrate provided with the OLED element;
    wherein the OLED element comprises a metal electrode, the detection unit is made of a metal, the detection unit and the metal electrode is formed in one patterning process.

11. The OLED display device according to claim 9, wherein the OLED display device further comprises an OLED module, the OLED module being arranged on a region of the substrate corresponding to the non-display region and configured for simulating an operational state of the OLED element,
    wherein the detection unit is located on a surface of the OLED module facing away from the substrate.

12. The OLED display device according to claim 11, wherein the OLED module has a same structure as the OLED element.

13. The OLED display device according to claim 9, wherein the detection unit is block-shaped, and a plurality of detection units are uniformly distributed surrounding the display region.

14. The OLED display device according to claim 9, wherein the packaging structure comprises a packaging cover plate opposite to the substrate, wherein the detection unit is located on a surface of the packaging cover plate facing towards the substrate.

15. The OLED display device according to claim 1, wherein the OLED display device comprises a display region and a non-display region surrounding the display region, the detection unit is located within a non-light transmittance region of the display region.

16. The OLED display device according to claim 1, wherein the detection unit comprises at least one layered structure, wherein a material for the detection unit comprises one of metal, organic material or fluorescent probe molecules, and wherein the detection unit is fabricated by means of an evaporation process or an inkjet printing process.

17. A method for detecting and repairing packaging effects for the OLED display device according to claim 1, the method comprising:
    detecting the detection unit to determine whether the detection unit is eroded;
    screening out an OLED display device having a packaging failure, in which the detection unit is eroded.

18. The method according to claim 17, the OLED display device comprising a display region and a non-display region surrounding the display region, the non-display region being provided with an annular repair unit surrounding the display region, wherein the method further comprises:
    determining whether the packaging structure of the OLED display device having a packaging failure will be repaired;

when repairing the packaging structure of the OLED display device having a packaging failure, treating the annular repair unit to form an annular reinforcement unit, the annular reinforcement unit being integrated with the packaging structure.

19. An OLED display device comprising a substrate, an OLED element and a packaging structure,
wherein a packaging cavity is formed between the packaging structure and the substrate, and the OLED element is located in the packaging cavity,
wherein the OLED display device further comprises a detection unit, the detection unit being located in the packaging cavity and having a chemical activity for oxygen not lower than that of the OLED element,
wherein the OLED display device comprises a display region and a non-display region surrounding the display region,
wherein a repair unit is arranged in the non-display region and configured for repairing the packaging structure upon detection of a packaging failure of the OLED display device by the detection unit.

* * * * *